United States Patent [19]

Iwasaki et al.

[11] Patent Number: 5,212,394

[45] Date of Patent: May 18, 1993

[54] COMPOUND SEMICONDUCTOR WAFER WITH DEFECTS PROPAGATING PREVENTION MEANS

[75] Inventors: Takashi Iwasaki; Naoyuki Yamabayashi, both of Osaka; Yoshiki Miura, Hyogo, all of Japan

[73] Assignee: Sumitomo Electric Industries, Ltd., Osaka, Japan

[21] Appl. No.: 932,288

[22] Filed: Aug. 19, 1992

Related U.S. Application Data

[63] Continuation of Ser. No. 613,550, Nov. 15, 1990, abandoned.

[30] Foreign Application Priority Data

Mar. 17, 1989 [JP] Japan ................... 1-66713

[51] Int. Cl.$^5$ .............................................. H01L 27/24
[52] U.S. Cl. ........................................ 257/1; 257/913; 257/183; 257/620; 257/622; 437/946; 437/126; 437/226
[58] Field of Search ............... 357/16, 40, 60, 55, 357/54, 52, 54 N; 437/965, 226, 946, 38, 249, 126

[56] References Cited

U.S. PATENT DOCUMENTS

| | | | |
|---|---|---|---|
| 3,453,508 | 7/1969 | Weinstein | 357/55 |
| 3,559,006 | 1/1971 | Otsuka et al. | 357/55 |
| 4,147,571 | 4/1979 | Stringfellow | 148/175 |
| 4,183,039 | 1/1980 | Aoki et al. | 357/55 X |
| 4,806,996 | 2/1989 | Luryi | 357/16 |
| 4,904,336 | 2/1990 | Ozawa et al. | 156/601 |

FOREIGN PATENT DOCUMENTS

| | | | |
|---|---|---|---|
| 47-15815 | 5/1972 | Japan | 437/946 |
| 52-143761 | 11/1977 | Japan | |
| 57-112074 | 7/1982 | Japan | 357/60 |
| 60-112694 | 6/1985 | Japan | |
| 61-261300 | 11/1986 | Japan | |
| 61-292340 | 12/1986 | Japan | 437/946 |
| 63-85082 | 4/1988 | Japan | |
| 63-274684 | 11/1988 | Japan | |

OTHER PUBLICATIONS

Schwuttke et al., "Etching of Vertical Walled Patterns in (100) Silicon," *IBM Technical Disclosure Bulletin*, vol. 14, No. 11, Apr. 1972, p. 3405.

Gaind et al., "Process for Etching Silicon," *IBM Technical Disclosure Bulletin*, vol. 16, No. 7, Dec. 1973, pp. 2291-2292.

Woodall et al., "Preparing Uniformly Doped and Dislocation Free GaAs Crystals", *IBM Technical Disclosure Bulletin*, vol. 12, No. 9, Feb. 1970, pp. 1482-1483.

Tohno et al., "X-Ray Topographic Observation of Dislocation Generation and Propagation in InP Single Crystal Grown by the Liquid-Encapsulated Czochralski Technique," *J. Appl. Phys.* 54(2), Feb. 1983, pp. 666-672.

Tada et al., "Growth of Low-Dislocation Density InP by the Modified CZ Method in the Atmosphere of Phosphorus Vapour Pressure", Inst. Phys. Conf. Ser. No. 91; Chapter 5, Paper Presented at Int. Symp. GaAs and Related Compounds, Heraklion, Greece, 1987, pp. 439-442.

Article: "The Growth and Characterization of Large Size, High Quality, InP Single Crystals", by Monberg et al., AT&T Bell Lab., Murray Hill, N.J.; vol. 135, No. 2; J. Electrochem. Soc.: Feb. 1988, pp. 500-503.

*Primary Examiner*—William Mintel
*Attorney, Agent, or Firm*—W. G. Fasse; D. H. Kane, Jr.

[57] ABSTRACT

A compound semiconductor epitaxial wafer has a heteroepitaxial crystal layer grown on a compound semiconductor crystal substrate which has a substantially circular configuration and is free of dislocation defects at least in a central area surrounded by a cut-off that prevents defects from propagating radially inwardly into said central area.

15 Claims, 3 Drawing Sheets

COMPOUND SEMICONDUCTOR WAFER WITH DEFECTS PROPAGATING PREVENTION MEANS

This application is a continuation of application Ser. No.: 07/613,550, Filed On: Nov. 15, 1990, now abandoned.

FIELD OF THE INVENTION

The present invention relates to a compound semiconductor epitaxial wafer in which a heteroepitaxial crystal layer is formed above a compound semiconductor single crystal substrate.

BACKGROUND INFORMATION

An optical element such as a light emitting element or a photoreceptor has a structure obtained by skillfully combining regions which have different optical and electrical properties. In addition, the production necessarily takes place by an epitaxial technique since such a structure must be formed by a single layer of crystals on a base of already completed crystals. Epitaxial crystals are classified into homoepitaxial crystals and heteroepitaxial crystals, depending on whether a substrate and an epitaxial layer formed on the substrate are of the same material or of different materials.

In a conventional compound semiconductor heteroepitaxial wafer, upper, lower, left and right portions of a substrate having a diameter of two inches, for example, are cut off to shape the substrate into a rectangular configuration and thereafter an epitaxial growth is caused on the rectangular substrate by a liquid phase growth method or by a vapor phase growth method. These methods take into consideration the technical restriction on an epitaxial growth on the compound semiconductor substrate. However, such a conventional rectangular epitaxial wafer has had the following problems. One problem is the fact that the thickness of a resist film applied by spin coating or the like, is heterogenized at corner portions of the outer periphery in a pattern formation such as photolithography whereby a good pattern formation cannot be achieved in these corner portions and the yield is reduced. Another problem is the fact that the corner portions tend to crack or chip in response to a physical impact or the like due to the rectangular configuration. Hence, the manufacturing yield is reduced.

As a method of solving such problems, it is possible to use an epitaxial wafer having a circular configuration. A high yield has actually been obtained by employing a circular substrate for a silicon semiconductor. However, the present inventors have found that a high yield cannot be achieved by directly employing a compound semiconductor heteroepitaxial wafer having a circular configuration. This finding is dissimilar to what is known regarding silicon semiconductors, as will now be described.

In a compound semiconductor, it is rather difficult to grow single crystals while completely maintaining a stoichiometric composition, as compared with crystals of a simple substance such as silicon. Thus, bulk crystals of a compound semiconductor are generally inferior in their completeness to silicon. For example, in a generally used substrate of a compound semiconductor having a circular configuration, the defects are concentrated in its outer periphery, and the defects propagate toward an epitaxial crystal layer if epitaxial growth is caused on this peripheral portion. It has been recognized that the defects of the outer peripheral portion, particularly slip defects, propagate and extend toward a wafer center portion, which initially is absolutely non-defective in itself. This propagation after epitaxial growth is due to thermal stress and physical stress during a working step performed on a semiconductor device. A detailed description of slip defects is provided in J. Appl. Phys. 52(2), February 1983, p. 666–672, for example. The definition of slip defects is directed to at least ten crystal defects aligning on a straight line of 1 mm.

SUMMARY OF THE INVENTION

It is an object of the present invention to provide a compound semiconductor wafer which can solve the above problems of the prior art to improve the yield.

The present invention is directed to a compound semiconductor epitaxial wafer having a heteroepitaxial crystal layer formed on a compound semiconductor single crystal substrate, wherein said compound semiconductor epitaxial wafer is characterized in that the compound semiconductor single crystal substrate has a substantially circular configuration and is free of dislocations. A dislocation free region need not necessarily extend over the entire substrate. More specifically, if means for cutting off a linkage of crystals in the heteroepitaxial crystal layer are provided as hereinafter described, a dislocation free portion may be provided in a region enclosed by said cutting off means. In a preferred embodiment of the compound semiconductor wafer according to the present invention, compound semiconductor single crystals form a compound semiconductor substrate of elements selected from groups III-V of the periodic table of elements.

In a more preferred embodiment of the present invention, a group III-V compound semiconductor is GaAs or InP.

In a further preferred embodiment of the present invention, a compound semiconductor having a lattice constant which is substantially identical to the lattice constant of the group III-V compound semiconductor crystals, contains at least two elements selected from the group consisting of Ga, As, Al, In and P.

In a further preferred embodiment of the present invention, a compound semiconductor wafer is provided with means for cutting off a linkage between crystals in a heteroepitaxial crystal layer.

According to the present invention, it is possible to provide a heteroepitaxial crystal wafer which will not transfer large crystal defects to a heteroepitaxial crystal layer formed on a substrate over the entire surface whereby the compound semiconductor substrate is dislocation free. Further, since the compound semiconductor substrate has a substantially circular configuration, it is possible to remarkably increase the production yield without causing heterogeneity of a resist film, which has been observed in the case of employing a conventional rectangular substrate. In addition, it is now possible to obtain a device which has excellent characteristics over the entire region of a circular configuration without causing new crystal defects by thermal stress and physical stress caused by an external force applied in an intermediate stage of working the device. Any propagation of crystal defects is also prevented.

When a compound semiconductor substrate still having crystal defects is employed, a similar effect can be attained by cutting off a linkage in a heteroepitaxial layer so that no bad influence is exerted by existing crystal defects.

BRIEF DESCRIPTION OF THE DRAWINGS

FIG. 1 is a front elevational view showing a substrate obtained by slicing an ingot;

FIG. 2 is a front elevational view showing an epitaxial wafer after heteroepitaxial growth;

FIG. 3 is a front elevational view showing the substrate after pattern formation working;

FIG. 4 is a front elevational view showing a substrate obtained by slicing an ingot;

FIG. 5 is a front elevational view showing an epitaxial wafer heteroepitaxially grown on a rectangular portion cut out along broken lines in FIG. 4;

FIG. 6 is a front elevational view showing the substrate after pattern formation working;

FIG. 7 is a front elevational view showing a substrate obtained by slicing an ingot, whereby an epitaxial wafer after heteroepitaxial growth is similar to the state shown;

FIG. 8 is a front elevational view showing the substrate after pattern formation working;

FIG. 9 is a plan view showing a wafer obtained after growing heteroepitaxial crystal layer above a compound semiconductor single crystal substrate;

FIG. 10 is a plan view showing a wafer after working the semiconductor wafer of FIG. 9 by a conventional method;

FIG. 11 is a plan view showing the wafer which is provided in its outer peripheral portion with means for cutting off a linkage between crystals in the heteroepitaxial crystal layer in the wafer shown in FIG. 9;

FIG. 12 is a plan view showing a wafer which is provided with the means for cutting off a linkage between crystals in the heteroepitaxial crystal layer of the wafer shown in FIG. 9 in the form of a lattice for enclosing every element;

FIG. 13 shows trenches as an example of a cut-off device;

FIG. 14 is a plan view showing the outer peripheral portion of a wafer as the portion which includes defects;

FIG. 15 is a sectional view showing one typical crystal defect of defects that may be present in the wafer of FIG. 9;

FIG. 16 is a sectional view showing the propagation of the crystal defect to the epitaxial crystal layer in the wafer of FIG. 10;

FIG. 17 is a sectional view showing a section through the wafer of FIG. 13;

FIG. 18 is a sectional view showing a state of propagation of the crystal defect in the epitaxial layer after device-working the wafer of FIG. 17.

DETAILED DESCRIPTION OF PREFERRED EXAMPLE EMBODIMENTS AND OF THE BEST MODE OF THE INVENTION

Before explaining Examples of the present invention, the present invention is first described in further detail.

A compound semiconductor epitaxial wafer according to the present invention is characterized by a compound semiconductor single crystal substrate of substantially circular configuration and having formed thereon a heteroepitaxial crystal layer which is free of any dislocation.

In a method of improving the heterogeneity of a resist film formed by spin coating, it may be relatively easy to employ a substrate having a substantially circular configuration in place of the conventional rectangular substrate. However, the present invention is specifically characterized in that a substrate having a substantially circular configuration, which is dislocation free, is employed as a substrate for forming an epitaxial crystal layer.

It has been found according to the invention that the yield cannot be improved in the case of employing a substrate, which has a substantially circular configuration but is not dislocation free, as is used in general. The term dislocation free means a state including no slips (linear defects) with EPD (etch pit density; crystal defect density) of not more than 500/cm$^2$. As mentioned above, such slips are described in detail in the aforementioned literature, and the definition thereof indicates at least ten crystal defects aligning on a straight line of 1 mm.

The present invention improves the heterogeneity caused by spin coating thereby also improving the yield by employing a substrate having a substantially circular configuration, as well as to prevent a reduction of the yield caused by propagation of defects, particularly slips, by employing a dislocation free substrate.

Figure 4:
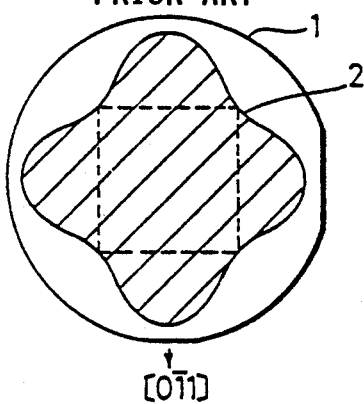
FIGS. 4 to 6 are front elevational views illustrating conventional methods of growing an epitaxial layer on a rectangular substrate.
Figure 5:
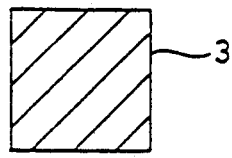
Figure 6:
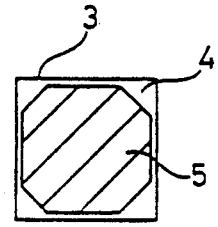

FIGS. 4 to 6 are front elevational views for illustrating a conventional method of growing an epitaxial crystal layer on a rectangular substrate.

FIG. 4 is a front elevational view showing a substrate 1 which is obtained by slicing a compound semiconductor single crystal ingot, for example an InP single crystal ingot. The substrate plane of a circular InP single crystal substrate 1 is the (100) plane. The cleavable directions of the single crystal substrate are [011] and a direction perpendicular thereto. The circular InP single crystal substrate 1 is a generally used InP single crystal substrate which has a portion with crystal defects and slips widely spread. This portion exists in the outer peripheral area along the [001] direction and in the direction perpendicular thereto. A dislocation free portion or area 2 is surrounded by a curved line in FIG. 4. Inside of such a dislocation free portion 2, upper, lower, left and right sections are cut off in a configuration shown by dotted lines in FIG. 4, to make a rectangular substrate. Epitaxial growth is caused on this rectangular substrate. Therefore, substantially no slips have existed in the conventional rectangular substrate.

FIG. 5 is a front elevational view showing a substrate after heteroepitaxial growth. Referring to FIG. 5, an available effective portion is shown with hatching. In other words, the entire rectangular wafer 3 is substantially effective. Then a resist film is applied onto this rectangular wafer 3 by spin coating or the like, to perform a pattern formation working.

FIG. 6 is a front elevational view showing the substrate after the pattern has been formed. Referring to FIG. 6, an effective portion 5 is shown with hatching and corner portions 4 of the rectangular wafer 3 define a heterogeneous resist portion 4, whereby the available portion is further reduced with a respective reduction in the yield.

Figure 7:
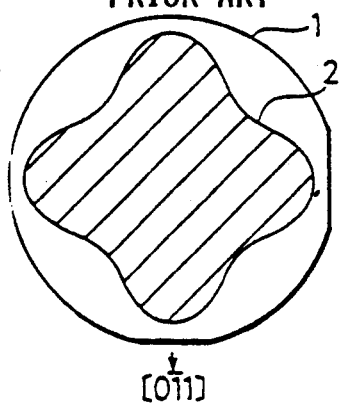
FIGS. 7 and 8 are front elevational views illustrating a conventional comparative method of growing an epitaxial layer on a circular substrate which is not dislocation free.
Figure 8:
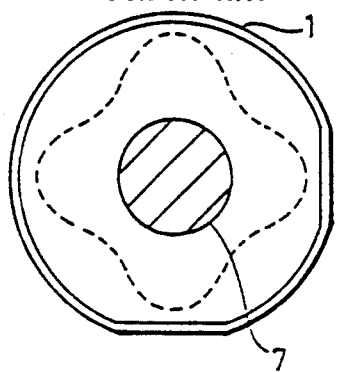

FIGS. 7 and 8 are front elevational views illustrating a method of growing an epitaxial layer on a circular substrate which is not dislocation free.

FIG. 7 is a front elevational view showing a substrate which is obtained by slicing an ingot, similarly to the substrate shown in FIG. 4. In this case, the substrate is not rectangularly cut out and shaped dissimilarly to the conventional method, but heteroepitaxial growth is directly made on the circular substrate. The state of the epitaxial wafer after heteroepitaxial growth is similar to that of FIG. 7 since it directly receives crystal defects of the substrate.

FIG. 8 is a front elevational view showing the substrate after pattern formation working has been completed. Referring to FIG. 8, a portion with hatching shows an effective area 7. Thus, slips in the outer peripheral portion of a circular InP single crystal substrate 1 are inwardly propagated by stress occurring when the device is worked, and hence the dislocation free portion or area is reduced.

Thus, when an epitaxial wafer provided on a circular substrate which is not dislocation free, is exposed to processing steps, slips inevitably reach a portion, which has been dislocation free, after heteroepitaxial growth, and an effective portion or area is rather reduced to lower the yield.

Figure 1:
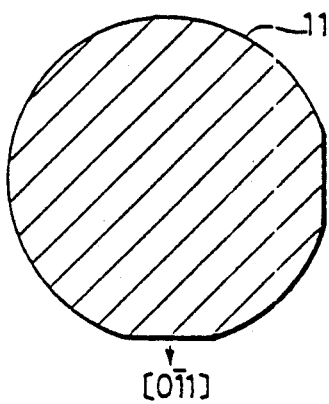
FIGS. 1 to 3 are front elevational views for illustrating a method of growing an epitaxial layer on a dislocation free circular substrate according to the present invention.
Figure 2:
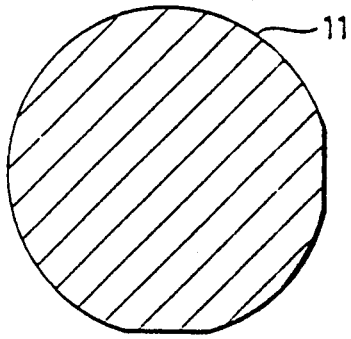
Figure 3:
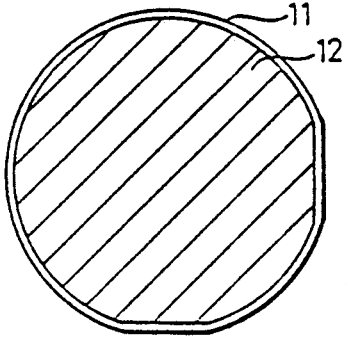

FIGS. 1 to 3 are front elevational views for illustrating a method of growing an epitaxial layer on a dislocation free circular substrate in accordance with the present invention.

FIG. 1 is a front elevational view showing a state of a substrate which is obtained by slicing an ingot of a compound semiconductor such as GaAs or InP etc. obtained by a VCZ method described below, for example, and a dislocation free portion is shown with hatching. As shown in FIG. 1, the dislocation free portion extends substantially over the entire surface of a circular compound semiconductor single crystal substrate 11.

FIG. 2 is a front elevational view showing an epitaxial wafer after a heteroepitaxial growth has been completed on the substrate 11 shown in FIG. 1. In FIG. 2, the dislocation free portion is shown with hatching, which extends substantially over the entire region of the substrate 11 after the heteroepitaxial growth has been completed.

FIG. 3 is a front elevational view showing a state of the substrate after processing steps for forming a pattern have been completed. A hatched portion shows an effective area 12 indicating that most of the area of the substrate 11 defines the effective portion 12 except for a small peripheral rim of the substrate 11. Thus, according to the present invention, it is possible to perform working or processing steps while maintaining the effective area of the substrate at the maximum thereby improving the yield.

A compound semiconductor single crystal substrate, which has a substantially circular configuration and is dislocation free, employed by the present invention can be obtained by slicing an ingot obtained by a VCZ (Vapor Pressure Control Czochralski) method, for example. This VCZ method involves a liquid encapsulation Czochralski method for causing a crystal growth in a vapor pressure, by using a group V element in the case of preparing a group III-V compound semiconductor single crystals, for example.

More specifically, the ingot is obtained in the following manner:

A vessel which can airtightly contain a high-temperature group V element is provided in the interior of a chamber employed for performing a Czochralski method such as the LEC (Liquid Encapsulated Czochralski) method for which a crystal pull shaft and a rotary crucible are installed through upper and lower walls of the vessel. Clearances between the vessel and the crystal pull shaft and the rotary shaft of the crucible are made airtight by a liquid sealant.

A raw material contained in the crucible is molten by heating the vessel from the exterior, and a seed crystal fixed to the forward end of the crystal pull shaft is dipped in the molten solution of the raw material and pulled while rotating, thereby growing cylindrical single crystals.

Due to the pressure of the gaseous group V element held in the vessel, no group V element is desorbed from the surfaces of the single crystals during growth thereof. In other words, no defects are caused on the basis of desorption of the group V element. At the same time, a temperature difference between the crystal and the molten raw material can be reduced by this effect, whereby no defects are caused by thermal contraction stress and the defects are not more than one % as compared with those of conventional method, since it is possible to eliminate slips.

The foregoing VCZ method is described in detail in Inst. Phys. Conf. Serial No. 91: chapter 5, 1987 by K. Tada et al.

It is also possible to use single crystals obtained by a VGF (Vertical Gradient Freeze) method, which are dislocation free. This VGF method employs already synthesized compound semiconductor single crystals as a raw material, introducing the same into a crucible and melting the same, and thereafter bringing the molten solution into contact with a seed crystal which is arranged on the lower end of the crucible to perform seeding, for upwardly growing compound semiconductor single crystals by gradually performing cooling from the lower end by providing a temperature gradient in a direction perpendicular to the molten solution. The VGF method, is described in J. Electrochem. Soc. Solid-State Science and Technology, Vol. 135, NO. 2 February 1988; or in Japanese Patent Laying-Open Gazette No. 63-85082 published Apr. 15, 1988; and Japanese Patent Laying-Open Gazette No. 63-274684, published Nov. 11, 1988.

In the present invention, periodic table group III-V compound semiconductors such as GaAs, GaP, InSb, GaSb, and InP etc., for example, can be used for the compound semiconductor single crystal substrate. A heteroepitaxial growth layer formed on the surface of said compound semiconductor single crystal substrate may be grown through another crystal layer or may be directly grown.

With respect to a GaAs substrate, for example, GaP, GaAlAs, GaAsP, InGaAlP, InAlAsP, AlAs, InGaP, InAlP, AlSbP, AlAsSbP, GaAsSbP, and GaSbP etc., can be employed for heteroepitaxial growth layers.

Similarly, with respect to an InP substrate, InAlAsP, InGaAs, InGaAsP, InGaSbAs, GaSbAs, GaSbAsP, GaSbP, InAlSbAs, AlAsSb, GaAlSbAs, InAlSbP, AlSbP, AlGaSbP, InGaSbP, InSbP, AlSbP, AlGaSbP, AlGaSbP, and GaSbP etc. can be employed for heteroepitaxial growth layers.

The thickness of the heteroepitaxial crystal layer is not necessarily critical since differences in the thermal expansion coefficient, differences in the stress and the like may vary with the combination of the compound semiconductor substrate material and the crystal layer. Said thickness can be varied with regard to the object or purpose of the final device etc.

A compound semiconductor provided with means for cutting off a linkage between crystals in a heteroepitaxial crystal layer, which is a more preferred embodiment of the present invention, is now described.

An epitaxial wafer formed on the surface of a compound semiconductor single crystal substrate, was processed or formed and thereafter examined in detail. It was found that elements having undesired photoelectric characteristics were linked to a ring portion around the wafer center, which was nondefective in itself. Such a ring portion extended continuously from the outer peripheral portion. It is believed that such a ring portion was caused by the fact that crystal defects were newly caused in a working process after completion of the epitaxial growth. So-called slips in the outer peripheral portion of the epitaxial wafer are propagating inwardly when the device is subjected to a heat treatment after a prior working step. A layer portion which is most easily exposed to stress is an interface portion between heteroepitaxial layers having different thermal expansion coefficients. Therefore, a groove was formed along the outer peripheral portion for separating the outer peripheral portion with its crystal defects, from a groove radially more inward portion not having any crystal defects etc. after epitaxial growth, in order to prevent the propagation of the slips. Such a groove is generally called a trench. When the wafer provided with this trench was worked or processed good photoelectric characteristics were obtained in the portion enclosed by the trench, since any bad influence from the outer peripheral ring portion of the wafer had disappeared.

The foregoing is described with reference to the drawings of FIGS. 9 to 14 and FIGS. 15 to 18.

Figure 9:
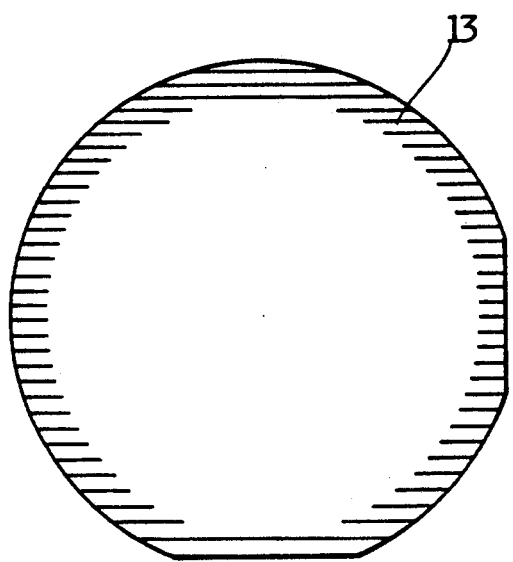
FIGS. 9 to 14 are plan views showing the propagation of defects due to working of an epitaxial wafer obtained by growing a heteroepitaxial crystal growth layer on a compound semiconductor.
Figure 15:
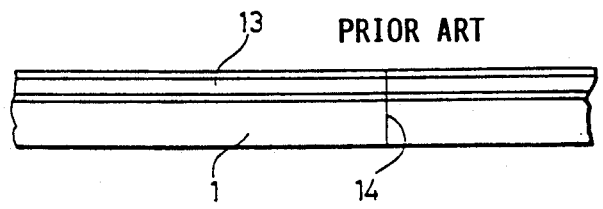
FIGS. 15 to 18 are sectional views showing the propagation of a crystal defect as a result of working an epitaxial wafer.

FIG. 9 shows a wafer after a heteroepitaxial crystal layer 13 has been grown on a compound semiconductor single crystal substrate 1. FIG. 15 shows a section of the wafer shown in FIG. 9. As typically shown in FIG. 15, a crystal defect 14 in the substrate is transferred from the substrate to the epitaxial crystal layer 13 when growing this crystal layer.

Figure 10:
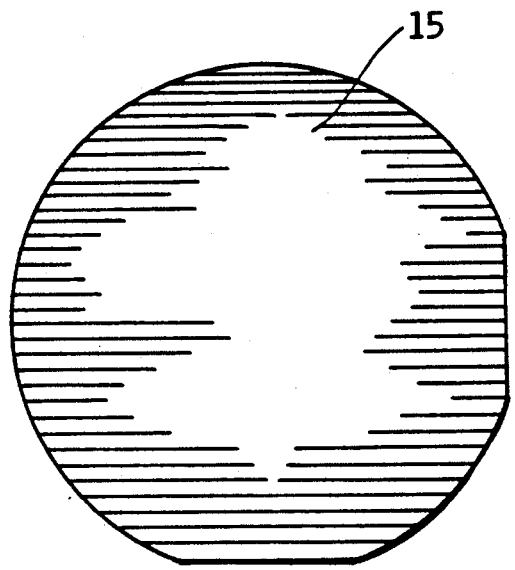
Figure 16:
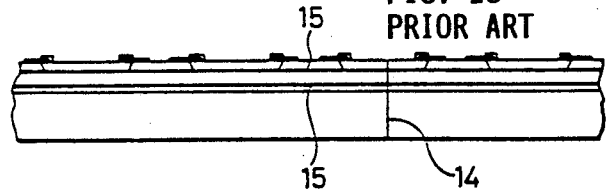
Figure 18:
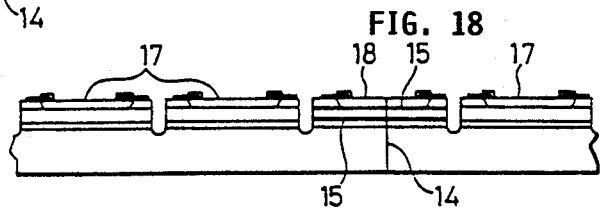

When a wafer having such crystal defects is worked to form a semiconductor device, crystal defects 15 are propagated along the plane of the epitaxial crystal layer, as shown in FIG. 10. If devices are formed on such a wafer having the propagated crystal defects 15, the crystal defects 15 result in defective chips. FIG. 16 is a sectional view showing the forming of semiconductor devices on such a wafer having crystal defects 15 propagated therein. As shown in FIG. 18, a defective chip 18 is caused by the presence of the propagated crystal defects 15.

Figure 11:
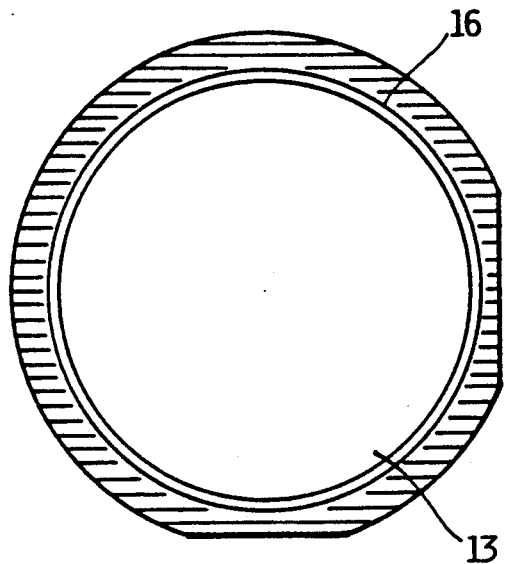
Figure 12:
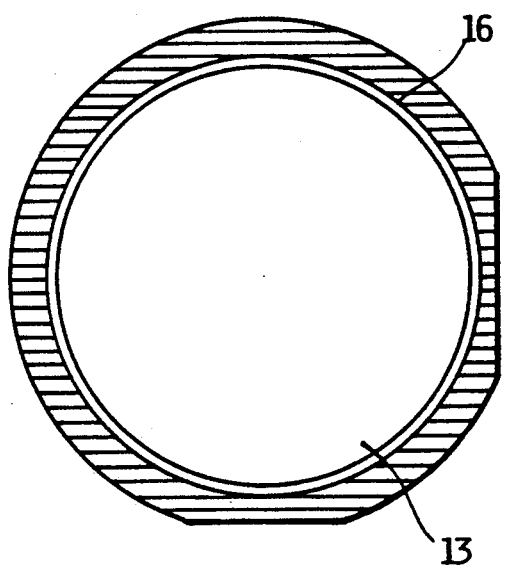
Figure 17:
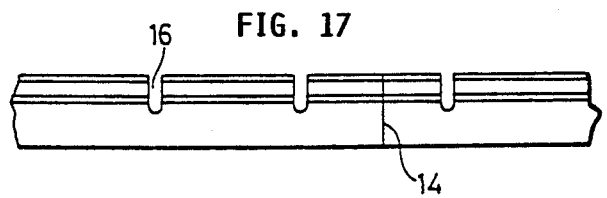

In a wafer provided with means 16 for cutting off linkage between crystals in a heteroepitaxial crystal layer, which is a more preferred embodiment of the present invention, it is possible to prevent the propagation of crystal defects by those cut-off means. FIG. 11 is a plan view showing a wafer which is provided on the inside of its outer peripheral portion with a trench 16 for cutting off the linkage between crystals. FIG. 17 is a sectional view showing a section of such a wafer. When the wafer shown in FIG. 11 is worked to form a semiconductor device, crystal defects 15 propagated along the plane of the crystal layer are stopped by the trench 16, which prevents that crystal defects 15 are propagated toward the inner zone. FIG. 12 is a plan view showing the effect of the trench 16.

As shown in FIG. 17, the trench 16 preferably has a depth exceeding the thickness of the epitaxial crystal layer. As shown in FIG. 18, propagation of the crystal defects 15 is prevented by formation of the trenches 16, whereby only a portion close to the crystal defects 14, 15 defines a defective chip 18 and good chips 17 can be obtained in other regions. Thus, it is possible to remarkably improve the fabrication yield of semiconductor chips.

Figure 13:
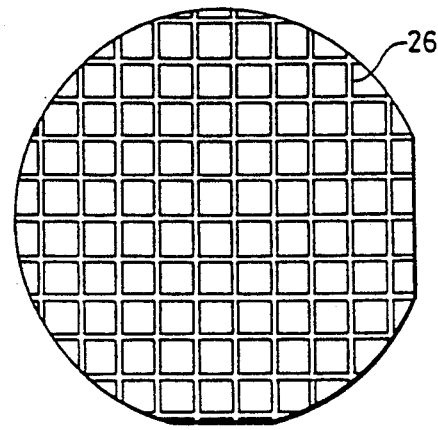

Although the trench is formed along the outer peripheral portion of the wafer in the aforementioned example, such a trench may be formed in dimensions corresponding to one element of the chip. FIG. 13 shows examples of such trenches 26 forming a grid pattern.

Figure 14:
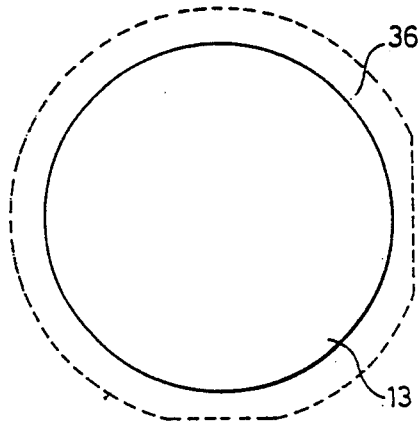

As to the means for cutting off linkage between crystals, there is also a method of completely removing a portion including defects, in addition to formation of a trench, which is formed as a groove by etching. FIG. 14 shows a wafer from which an outer peripheral portion 36 of an epitaxial crystal layer including such defects has been removed.

As to still another cut-off means, an outer peripheral portion of a substrate including a large number of crystal defects, may be covered with a film of $Si_xN_y$, $SixOy$ or the like, in order to cause a selective growth only in a dislocation free portion.

EXAMPLE 1

A dislocation free GaAs substrate obtained by the VCZ method and a generally used substrate still having crystal defects left in its outer peripheral portion were compared and studied as follows:

Heteroepitaxial wafers were prepared by successively growing P-type $Al_xGa_{l-x}As$ (x=0.3) layers of 100 μm as first layers, P-type $Al_xGa_{l-x}As$ (x=0.02) light emitting layers as second layers, and N-type $Al_xGa_{l-x}As$ (x=0.4) layers as third layers on circular GaAs substrates of 350 μm thickness and 75 mm in diameter.

After completion of the epitaxial growth, crystal defect distributions in the epitaxial layers and in the substrate were observed through X-ray topographic observation, whereby it was recognized that crystal defects were transferred toward the N-type $Al_xGa_{l-x}As$ layer, the third layer, in the conventional substrate.

On the other hand, no transfer or propagation of crystal defects was recognized in the dislocation free substrate.

A heteroepitaxial wafer having such a crystal structure is mainly applied in an infrared LED etc. The above heteroepitaxial wafers were employed and subjected to working for forming a device, to evaluate in-plane distributions of the emission strength. In the conventional waver, portions having a low emission strength were unevenly distributed in a portion still having crystal defects left. Further, the portions having a low emission strength spread toward the wafer center portion, which had no crystal defects, after epitaxial growth. In the dislocation free epitaxial wafer, on the other hand, the emission strength of at least 2 mW was attained over the entire surface without depending on locations.

Then, in accordance with another aspect of the present invention, the outer peripheral portion, still having crystal defects left therein, was removed from the conventional epitaxial wafer by etching. Thereafter, working was performed to form a semiconductor device. The in-plane distribution of the emission strength was evaluated in the epitaxial wafer to which this technique was applied, whereby it was possible to attain an emission strength of at least 2 mW over the entire surface. A sample was first worked to form a semiconductor device thereby leaving crystal defects in its outer peripheral portion. Then, the portion with defects was removed by etching. The resulting product was observed through X-ray topography prior to and after the etching, whereby it was found that slips propagated toward the wafer center portion in the product prior to etching while no crystal defects were observed in any portions of the product after the etching.

Similar phenomenons were investigated on heteroepitaxial layers of InGaP and InGaAsP provided on GaAs substrates. Such crystal layers are employed in short wavelength lasers. Similar phenomenons were also observed in these crystal layers, and it was recognized that the same had problems common to heteroepitaxial wafers having substrates of GaAs and the present invention is also effective on compound semiconductors.

EXAMPLE 2

A dislocation free InP substrate obtained by the VCZ method and a generally used substrate still having crystal defects left in its outer peripheral portion, were compared and studied as follows: Circular substrates of 350 $\mu$m in thickness and 50 mm in diameter were divided into halves, respectively. These halves of the substrates were abutted against each other to cause a simultaneous epitaxial growth on both halves. The epitaxial layers were successively grown in structures of InP layers of 2 $\mu$m in thickness for first layers. InGaAs layers of 5 $\mu$m in thickness for second layers, and InP layers of 2 $\mu$m in thickness for third layers.

After the epitaxial growth, a distribution of crystal defects was observed by an etching method, to recognize that crystal defects were transferred toward the InP layer, the third layer, through the InGaAs layer in the outer peripheral portion of the conventional InP substrate. In the dislocation free InP substrate fabricated by the VCZ method, on the other hand, no crystal defects were observed in the respective epitaxial layers. In addition, no crystal defects were observed in an X-ray topographic observation. Thus, it was confirmed that the transfer of crystal defects recognized in the conventional InP substrate was not caused by epitaxial growth, but the cause therefor was the defective InP single crystal substrate as used.

Crystals having such crystal structures are mainly applied to a long waveband light emitting element, a PIN photodiode, and the like. The aforementioned respective epitaxial wafers were employed and processed to measure dark currents, which are noise components, to find that portions having high dark currents were unevenly distributed in an area still having crystal defects in the conventional wafer. Further, it was recognized that portions having high dark currents were also propagated to the wafer center area, which initially had no crystal defects, after the epitaxial growth.

On the other hand, the dislocation free epitaxial wafer exhibited an excellent dark current characteristic of not more than $3 \times 10^{-7}$ A/cm$^2$ when a voltage of $-5$ V was applied to the entire surface without depending on locations. To this end, it is possible that slips in the outer peripheral portion of the wafer linearly extend toward the central area in a heat treatment applied to the device. It was recognized that the portions having high dark currents, i.e., portions in which the dark current values were at least $3 \times 10^{-7}$ A/cm$^2$ at a voltage of $-5$ V, existed as an extension of the outer peripheral portion of the wafer of two inches, toward the central area, in correspondence to the distribution of the crystal defects as observed by etching.

In general, it was impossible to use a wafer of a circular configuration just obtained by slicing an ingot due to the restriction imposed on the epitaxial growth technique, and a rectangularly cut substrate has been employed conventionally. However, it was recognized that, even if a wafer of a circular configuration just obtained by slicing an ingot was used, portions which had been removed by cutting could not be used since crystal defects of the substrate were directly transferred to epitaxial crystal layers. It was further recognized that slips in the outer peripheral portion of the wafer were propagated toward a part of the substrate center portion or area having a low crystal defect density and portions attaining excellent dark current characteristics were reduced as compared with the case of employing a rectangularly cut substrate.

Then, a heteroepitaxial layer was removed in the form of a groove or trench prior to a heat treatment of the device, said groove extending along an outer peripheral portion of the epitaxial wafer still having crystal defects in its peripheral portion. Thereafter, 5000 devices were similarly formed. In-plane distributions of dark currents were measured on the inside enclosed by the trench, to check whether there were more than one hundred devices of at least $3 \times 10^{-7}$ A/cm$^2$ among the total of 5000. An X-ray topographic observation was simultaneously performed, whereby crystal defects such as slips could not be discovered. Thus, it is possible to obtain a larger number of semiconductor devices from one wafer as compared with the prior art, thereby remarkably improving the yield, by forming a trench in accordance with the present invention while causing an epitaxial growth on a dislocation free substrate.

EXAMPLE 3

A dislocation free substrate obtained by the VCZ method and a conventionally used substrate still having crystal defects in its outer peripheral portion were used for wafers provided with heteroepitaxial layers of InGaAsP, and these wafers were studied and compared. Circular substrates were produced with a first layer 350 $\mu$m thick, a second layer 1 $\mu$m thick, and a third layer of InP 2 $\mu$m thick. The second layers were InGaAsP structures of 1.3 $\mu$m in emission strength. After completion of the epitaxial growth, crystal defect distributions in the epitaxial layers and in the substrates were observed through X-ray topography, whereby it was found that the conventional substrate included crystal defects toward the third InP layer.

On the other hand, no transfer of crystal defects was observed in the dislocation free substrate. An epitaxial wafer having such a crystal structure is mainly applied to a long wavelength LED etc. The aforementioned heteroepitaxial wafers were employed and subjected to processing for making semiconductor devices to evaluate peak inverse voltages, emission strength, emission form defects and respective in-plane distributions.

In the conventional wafer, the peak inverse voltage was lowered (<1 V) in a portion still having crystal defects, and the emission strength was also lowered. The emission form was also defective. It was observed through X-ray topography that these crystal defects were propagated after processing toward a portion, having had no crystal defects, after heteroepitaxial growth.

In the InGaAsP heteroepitaxial layer provided on the dislocation free substrate, on the other hand, no crystal defects were observed after epitaxial growth and after processing. The peak inverse voltage was >2 V, while the emission strength was uniform in the plane and no defect of the emission form was observed.

While nondefective devices were not more than 1000 in the conventional wafer, it was possible to obtain at least 4000 nondefective devices in the dislocation free heteroepitaxial wafer, whereby the yield was remarkably improved.

The compound semiconductor wafer according to the present invention is applicable to a semiconductor device such as a photoreceptor e.g. a PIN photodiode, a laser and a light emitting element e.g. an LED, and an amplification element e.g. an FET, for example.

Although the invention has been described with reference to specific example embodiments, it will be appreciated that it is intended to cover all modifications and equivalents within the scope of the appended claims.

We claim:

1. A compound semiconductor epitaxial wafer, comprising a compound semiconductor single crystal substrate having a substantially circular configuration, a heteroepitaxial crystal layer formed on said compound semiconductor single crystal substrate, means for preventing a propagation of defects, said defects propagation preventing means forming part of said wafer and extending into said substrate to surround an area of said wafer prior to wafer processing so that defects starting outside said area during wafer processing of said wafer cannot propagate into said area surrounded by said defects propagation preventing means during said processing, and wherein said compound semiconductor single crystal substrate is free of dislocation defects at least within said area surrounded by said defects propagation preventing means.

2. The compound semiconductor wafer of claim 1, wherein said compound semiconductor single crystal substrate is made of a group III-V compound semiconductor, and the heteroepitaxial crystal layer formed thereon is a compound semiconductor crystal layer having a lattice constant substantially identical to the lattice constant of said group III-V compound semiconductor to such a degree that epitaxial crystal growth is possible.

3. The compound semiconductor wafer of claim 2, wherein said group III-V compound semiconductor is one of GaAs and InP.

4. The compound semiconductor wafer of claim 2, wherein said compound semiconductor having a lattice constant substantially identical to the lattice constant of said group III-V compound semiconductor includes a semiconductor containing at least two elements selected from a group consisting of Ga, As, Al, In and P.

5. The compound semiconductor wafer of claim 3, wherein said group III-V compound semiconductor is GaAs, and the heteroepitaxial crystals are of GaAlAs.

6. The compound wafer of claim 3, wherein said group III-V compound semiconductor is GaAs, and the heteroepitaxial crystal layer is of InGaP.

7. The compound semiconductor wafer of claim 3, wherein said group III-V compound semiconductor is GaAs, and the heteroepitaxial crystal layer is of InGaAlP.

8. The compound semiconductor wafer of claim 3, wherein said group III-V compound semiconductor is InP, and the heteroepitaxial crystal layer is of InGaAs.

9. The compound semiconductor wafer of claim 3, wherein said group III-V compound semiconductor is InP, and the heteroepitaxial crystal layer is of InGaAsP.

10. A compound semiconductor epitaxial wafer, comprising a compound semiconductor single crystal substrate, a heteroepitaxial crystal layer formed on said substrate, said substrate comprising a central area which is free of dislocation defects, said compound semiconductor wafer further comprising, as part of said wafer, means extending into said substrate for cutting off a linkage between a crystal portion in said central area of said substrate from a crystal portion outside said central area of said substrate, said cutting off means extending through said heteroepitaxial crystal layer and into said substrate prior to wafer processing, whereby said cutting off means suppresses propagation of crystal defects to said area free of dislocation defects during processing of said wafer.

11. The compound semiconductor wafer of claim 10, wherein said means for cutting off is a groove defined by removing part of said heteroepitaxial crystal layer along an outer peripheral rim of said wafer.

12. The compound semiconductor wafer of claim 10, wherein said means for cutting off is a removed portion close to the outer peripheral rim of said wafer.

13. The compound semiconductor wafer of claim 10, wherein said means for cutting off is a film covering a portion close to the outer peripheral rim of said wafer, said film permitting selectively growing said heteroepitaxial crystal layer only in said central area free of dislocation defects.

14. The compound semiconductor wafer of claim 13, wherein said film is an $Si_xN_y$ film.

15. The compound semiconductor wafer of claim 13, wherein said film is an $Si_xO_y$ film.

* * * * *

UNITED STATES PATENT AND TRADEMARK OFFICE
CERTIFICATE OF CORRECTION

PATENT NO. : 5,212,394

DATED : May 18, 1993

INVENTOR(S) : Takashi Iwasaki et al.

It is certified that error appears in the above-identified patent and that said Letters Patent is hereby corrected as shown below: Title page, In [30] Foreign Application Priority Data, please add the following:
-- March 15, 1990 (PCT) .... PCT/JP90/00348--, Signed and Sealed this First Day of February, 1994

Attest:

BRUCE LEHMAN

Attesting Officer     Commissioner of Patents and Trademarks